United States Patent [19]
Itoh et al.

[11] Patent Number: 5,482,804
[45] Date of Patent: Jan. 9, 1996

[54] RESIN COMPOSITION FOR COLOR FILTER

[75] Inventors: Hisato Itoh; Akio Karasawa; Kenichi Sugimoto, all of Kanagawa, Japan

[73] Assignee: Mitsui Toatsu Chemicals, Incorporated, Tokyo, Japan

[21] Appl. No.: 38,091

[22] Filed: Mar. 30, 1993

[30] Foreign Application Priority Data

Mar. 31, 1992 [JP] Japan .................................. 4-076572

[51] Int. Cl.⁶ ...................................................... G03F 9/00
[52] U.S. Cl. ................... 430/7; 430/23; 430/142; 430/145; 430/197
[58] Field of Search ................... 430/7, 197, 23, 430/27, 28, 142, 145

[56] References Cited

U.S. PATENT DOCUMENTS

| | | |
|---|---|---|
| 1,918,560 | 7/1933 | Rehlander . |
| 4,416,961 | 11/1983 | Drepage ................................ 430/7 |
| 4,808,501 | 2/1989 | Chiulli ................................. 430/7 |
| 4,837,097 | 6/1989 | Narang et al. ......................... 430/7 |
| 4,934,791 | 6/1990 | Shimizu et al. . |
| 4,943,512 | 7/1990 | Kawabata et al. ..................... 430/7 |
| 5,055,379 | 10/1991 | Bagachi et al. ........................ 430/7 |
| 5,236,793 | 8/1993 | Nishiwaki et al. ..................... 430/7 |
| 5,334,486 | 8/1994 | Abe et al. ............................. 430/281 |

FOREIGN PATENT DOCUMENTS 478117   11/1915  France .
2186099  8/1987   United Kingdom .

OTHER PUBLICATIONS

Derwent Abstract 86–141439/22 of Japanese Patent Laid–Open No. 77804/1986.

Derwent Abstract 86–025250/04 of Japanese Patent Laid–Open No. 247603/1985.

Derwent Abstract 24492C/14 of Japanese Patent Laid–Open No. 25067/1980.

*Flat Panel Display '90*, pp. 272–277.

*Flat Panel Display '91*, pp. 129–134.

*Photopolymer Technology*, Nikkan Kogyo Shinbun Co. Ltd., pp. 8–14, 125–127, and 447–450 Jun. 1979.

Nagamatsu et al., *Photosensitive Polymer*, Kodansha Scientific, pp. 109–122, 131–140, 143–148, 154–217, 226–227, 232–249, and 304 Jun. 1971.

*Photopolymer Handbook*, pp. 22–31, 32–39, 50–57, 388–391, and 592 Jun. 1990.

*Primary Examiner*—S. Rosasco
*Attorney, Agent, or Firm*—Millen, White, Zelano, & Branigan

[57] ABSTRACT

A photo-setting resin composition is here disclosed which comprises a photo-setting resin precursor and a dyestuff for uniformly coloring the photo-cured resin; and there is also disclosed a method for preparing a color filter by the use of this photo-setting resin composition.

15 Claims, 1 Drawing Sheet

FABRICATION PROCESS OF COLOR FILTER

FABRICATION PROCESS OF COLOR FILTER

RESIN COMPOSITION FOR COLOR FILTER

BACKGROUND OF THE INVENTION (i) Field of the Invention

The present invention relates to a photo-setting resin composition useful to prepare a color filter, and a method for preparing the color filter by the use of the composition.

(ii) Description of the Related Art

As methods for preparing color filters, there have been heretofore known a gelatin dyeing method, a pigment disperse method, an electrodeposition method, a printing method and the like [Flat Panel Display '90, pp. 272; Flat Panel Display '91, pp. 129; and Kinki Chemical Association Functional Dyestuff Section Society-Electronics Section Society Public Lecture Data (Nov. 20, 1991)].

The gelatin dyeing method is a method which comprises coating a substrate with a gelatin coating film provided with photosensitive properties of a dyed medium, carrying out irradiation of ultraviolet rays and aqueous development to form a relief pattern, and then dyeing this relief pattern with a dye. The pigment disperse method is a method which comprises coating a substrate with a photo-sensitive colored resist in which a pigment is uniformly dispersed, as in the case of the dyeing method, followed by exposure and development to form a predetermined pattern. Moreover, the electrodeposition method is a method which comprises electrochemically depositing, on an electrode, a polymeric resin solution in which a pigment is dispersed. Furthermore, the printing method is a method which comprises directly carrying out printing on a substrate by the use of an ink in which a pigment is dispersed.

In addition, as a quality improvement method for the color filter, a polyimide-dye mixing method is disclosed in Japanese Patent Application Laid-open No. 77804/1986.

Among the above-mentioned preparation methods, the pigment disperse method has been employed as a mass production technique from the viewpoint of durability and workability, and the preparation of the color filters is tried by this technique. Furthermore, the gelatin dyeing method has been employed from the viewpoint of light transmission properties.

However, with regard to the pigment disperse method, a pigment is insoluble in a photo-cured resin which is a binder. Therefore, when the filter obtained thereby is used for a liquid crystal display, light is scattered by pigment particles, so that polarization deteriorates to give rise to a depolarization effect that contrast on the liquid crystal display declines. With regard to the gelatin-dye dyeing method, the durability of the obtained filter is poor. In addition, when two or more colors are applied to one substrate, a color protection film of an acrylic resin, a urethane resin, an epoxy resin or the like must be formed after one color has been given, or alternatively the surface of a dyed medium must be chemically treated with tannic acid or the like to prevent color mixing, which makes the preparation process complex.

With regard to the polyimide-dye mixing method, the light transmission of the polyimide resin is poor, and its preparation process is inconveniently complex. Since an organic solvent such as N-methylpyrrolidone is used, this method is not good in point of environmental pollution.

SUMMARY OF THE INVENTION

An object of the present invention is to provide an aqueous solvent photo-setting resin composition for the preparation of a color filter which is free from any depolarization effect, has excellent durability, and is preferable for environmental protection.

Another object of the present invention is to provide a method for preparing a color filter by the use of the above-mentioned resin composition which does not require any formation of a color protection film to prevent the migration of a dye.

The present inventors have intensively investigated to solve the above-mentioned problems, and as a result, the present invention has now been completed. That is, the present invention is directed to a photo-setting resin composition comprising at least a photo-setting resin 10 precursor and a dyestuff which uniformly colors the photo-cured resin, and it is also directed to a method for preparing a color filter by the use of this photo-setting resin composition. Fundamentally, the present invention is concerned with an aqueous photo-setting resin composition containing the dyestuff in a dispersion state, and it is also concerned with a method for preparing a color filter by the use of this photo-setting resin composition.

In the present invention, a photo-setting resin composition in which a specific dyestuff is dispersed in a water-soluble photo-setting resin precursor is used, and therefore in preparing a filter, any color protection film does not have to be formed, so that the number of preparation steps can be reduced. In addition, the filter obtained therefrom is free from any depolarization effect and excellent in durability.

DETAILED DESCRIPTION OF THE PREFERRED EMBODIMENTS

Figure 1:
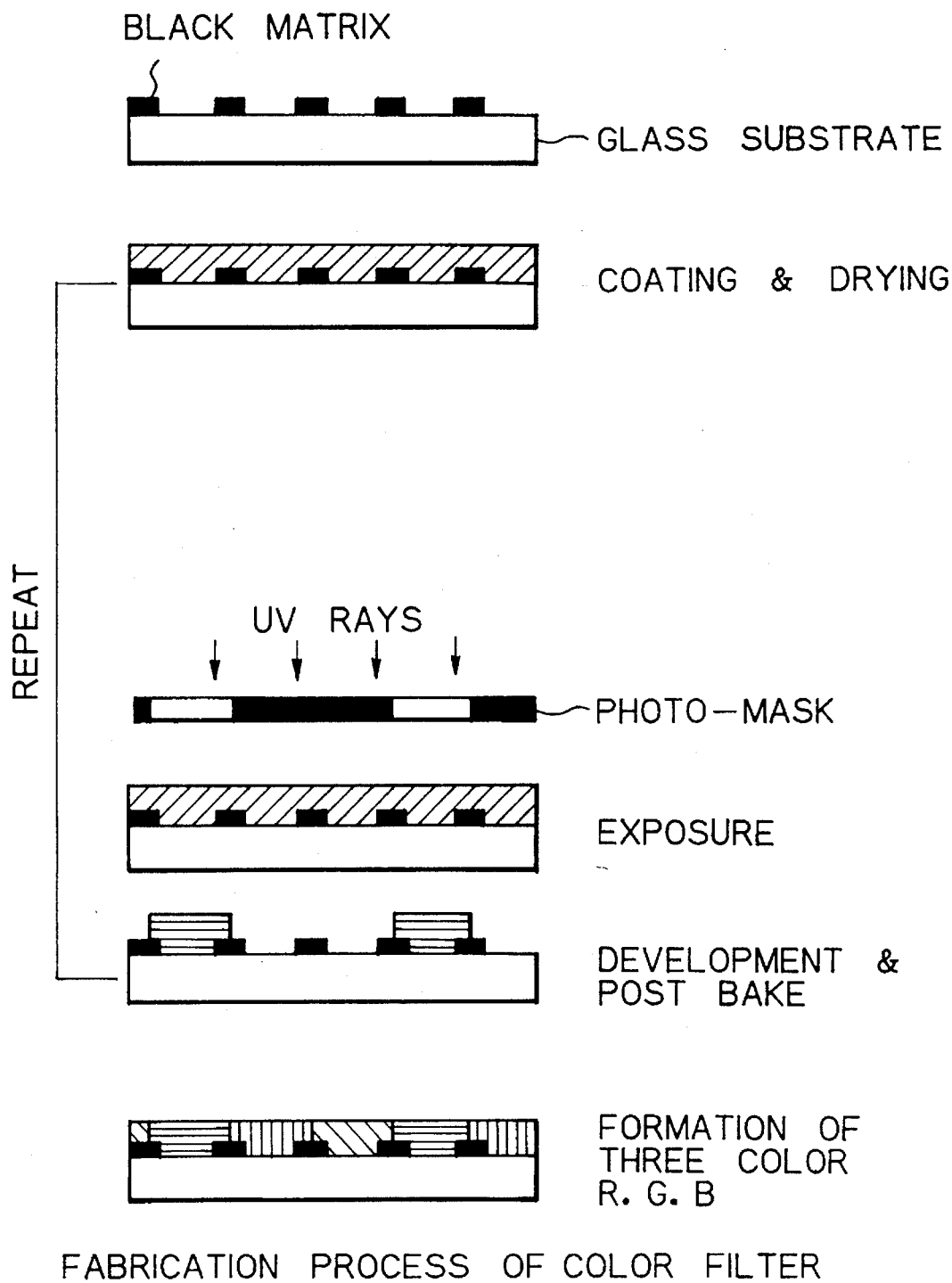
FIG. 1 is a schematic sectional flow sheet to explain the process of a preparation method of a color filter by the use of a resin composition of the present invention.

A photo-setting resin composition of the present invention has the following main features (1) to (3).

(1) The photo-setting resin precursor is a water-soluble resin, and the photo-cured resin is water-insoluble.

(2) A selected dyestuff is dispersed in an aqueous solution of the photo-setting resin precursor.

(3) The selected dyestuff has compatibility with the photo-cured resin.

A method for preparing a filter by using the photo-setting resin composition of the present invention, for example, as shown in FIG. 1, comprises (i) applying an aqueous photo-setting resin composition containing a dispersed dyestuff onto a glass substrate, if necessary, provided with a black matrix, (ii) drying the applied composition at 80° C. for 2 minutes, (iii) exposing the same to ultraviolet rays through a photomask, (iv) developing the same to form a colored pattern, (v) post-baking the same at 200° C. for 15 minutes, and (vi) repeating these steps (i) to (v) for other two colors.

In repeating the step (i) after the first coloring, the dyestuff of the colored layer on the glass substrate does not dissolve out and so color mixing does not occur, because of the above-mentioned features (1) and (2). Therefore, it is not necessary to form any color protection film, which can reduce the number of the preparation steps. Thus, the filter preparation method of the present invention has the advantage regarding the manufacturing process. In addition, because of the above-mentioned feature (3), the obtained filter is free from any depolarization effect and provides an image having good contrast, when used as a liquid crystal device.

The photo-setting resin precursor which can be used in the present invention means a material (1), (2), (3), or a mixture thereof.

(1) A resin having at least one sensitive group which can crosslink by light.

(2) A mixture of a photoreactive crosslinking agent and a resin having no photosensitive group.

(3) A mixture of monovalent to polyvalent monomers having photopolymerizable groups.

Examples of the sensitive group which can crosslink in the paragraph (1) include sensitive groups mentioned in, for example, Yamaoka/Nagamatsu, "Photopolymer Technology", Nikkan Kogyo Shinbun Co., Ltd., pp. 8–14 and pp. 125–127 (1988); Nagamatsu/Inui, "Photosensitive Polymer", Kodansha Co., Ltd., pp. 154–217 (1984); and Photopolymer Social Meeting, "Photopolymer Handbook", Industrial Inquiry Association, pp. 23–30 (1989). Typical examples of the sensitive group include the following compounds.

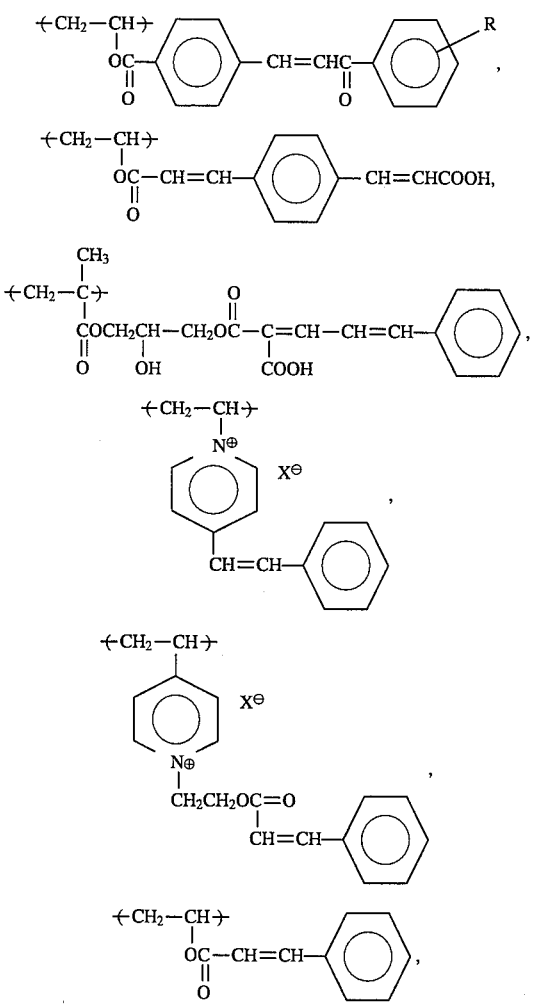

The amount of the sensitive group is preferably from 0.1 to 100 mole % based on the polymer.

Examples of the crosslinking agent in the preceding paragraph (2) include polyvalent diazonium salts and azido compounds, which are mentioned in literature, e.g., Nagamatsu/Inui, "Photosensitive Polymer", Kodansha Co., Ltd., pp. 109–122, 131–140, 145–148 and 233–248 (1984); and Photopolymer Social Meeting, "Photopolymer Handbook", Industrial Inquiry Association, pp. 23, 33–39 and 390 (1989). The amount of the crosslinking agent is preferably from 0.1 to 100% by weight based on the resin.

Examples of the polymerizable compound in the preceding paragraph (3) include acrylic compounds.

Examples of the polymerizable resins include a polyvinyl alcohol resin and derivatives thereof, polyacrylic resin and derivatives thereof, epoxy resin and derivatives thereof, polyimide precursors, polyamide resin and derivatives thereof, phenolic resin and derivatives thereof, polyester resin and derivatives thereof, polyvinyl acetate and derivatives thereof, polycarbonate resin and derivatives thereof, urethane resin and derivatives thereof, and copolymers thereof. Above all, the polyvinyl alcohol derivatives and acrylic derivatives are preferable, and 2-hydroxyethyl methacrylates, N,N-dialkylaminoethyl methacrylates and N-methylolacrylamides are more preferable. The molecular weight of the photopolymerizable resin is in the range of from about 500 to about 1,000,000.

The photo-setting resin composition of the present invention may contain a resin other than the photo-setting resin precursor, a polymerization initiator, a sensitizer, and other suitable additives, if necessary.

Examples of the preferable polymerization initiator include peroxides, diazo compounds, benzoin ether compounds, benzylketal compounds and ketone compounds, which are mentioned in literature, e.g., Yamaoka/Nagamatsu, "Photopolymer Technology", Nikkan Kogyo Shinbun Co., Ltd., pp. 447–450 (1988); Nagamatsu/Inui, "Photosensitive Polymer", Kodansha Co., Ltd., pp. 143, 144 and 226 (1984); and Photopolymer Social Meeting, "Photopolymer Handbook", Industrial Inquiry Association, pp. 51–56, 388 and 389 (1989).

On the other hand, the dyestuff which can be used in the present invention is preferably a dyestuff which is not dissolved in water, and examples of the dyestuff include oil-soluble dyes. The oil-soluble dye means a dye which can be dissolved as much as 1% by weight or more in any of aromatic hydrocarbons such as toluene and xylene, ketones such as cyclohexanone and methyl ethyl ketone, CELLOSOLVES such as ETHYLCELLOSOLVE, an ester such as ethyl acetate, ETHYLCELLOSOLVE acetate or tetrahydrofuran. Typical examples of these dyes include the following disperse dyes and oil colors, which are mentioned in literature, e.g., "Color Index", American Association of Textile Chemist and Colorists, Vol. 2–3; and K. Venkataraman, "The Chemistry of Synthetic Dyes", Academic Press, Vol. 3:

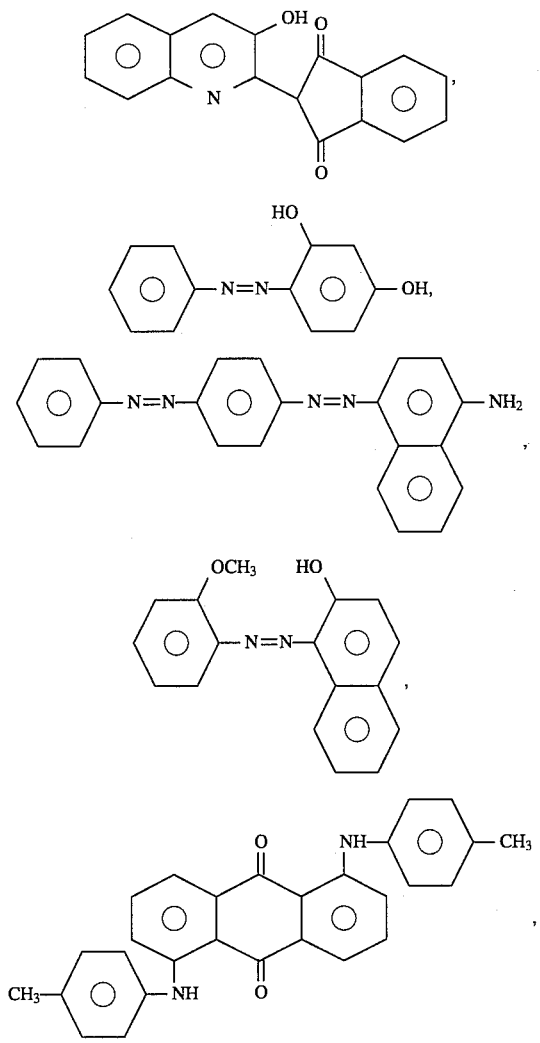

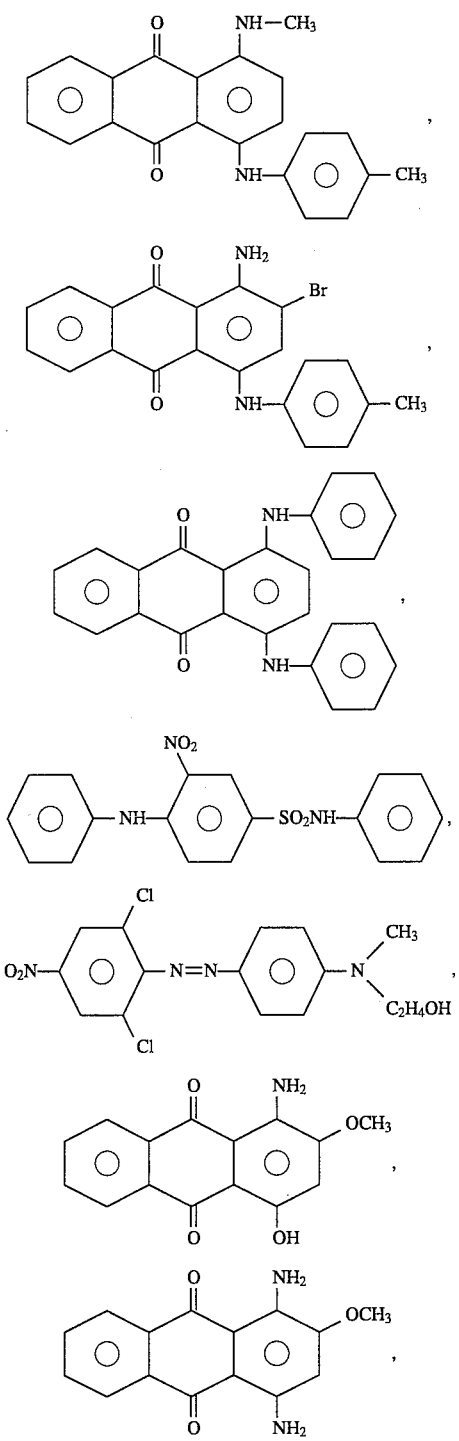

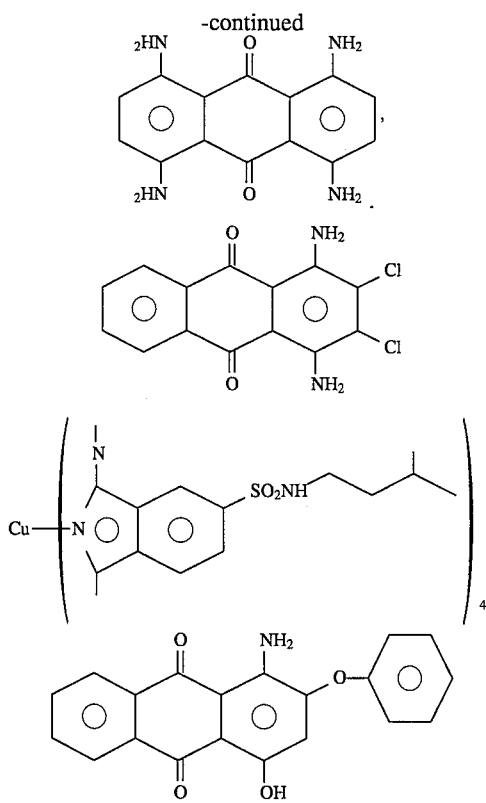

Examples of the more preferable dyestuffs include compounds having specific substituents represented by the formulae (1) to (5). Formula (1) being $$\text{Dye}^1-(SO_2-X^1-A^1-Y^1)_{q^1} \quad (1)$$

wherein $\text{Dye}^1$ is a color developing mother nucleus of the dyestuff; $X^1$ is an oxygen atom, sulfur atom or NH group; $A^1$ is an alkylene group, polyether connecting group or polyalkyleneamino connecting group; $Y^1$ is a hydrogen atom, alkoxyl group, dialkylamino group, alkylamino group, amino group, hydroxy group or trialkylammonium group; and $q^1$ is an integer of 1–10. Formula (2) being

wherein $\text{Dye}^2$ is a color developing mother nucleus of the dyestuff; $X^2$ is an oxygen atom, sulfur atom or NH group; each of $R^1$, $R^2$ and $R^3$ is independently an alkyl group having 1 to 10 carbon atoms; each of $l^1$, $m^1$, $n^1$ and $p^1$ is an integer of 0–10; and $q^2$ is an integer of 1–10. Formula (3) being

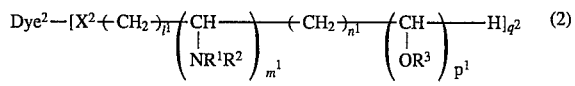

wherein $\text{Dye}^1$ is a color developing mother nucleus of the dyestuff; $X^3$ is an oxygen atom, sulfur atom or NH group; each of $R^4$ and $R^5$ is independently a hydrogen atom, methyl group or ethyl group; each of $y^2$ and $y^3$ is independently a hydrogen atom, OH group, SH group or $NH_2$ group; each of $l_2$ and $m^2$ is an integer of 0–10; and $q3$ is an integer of 1–10. Formula (4) being

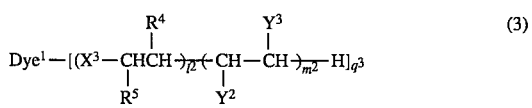

wherein $\text{Dye}^1$ is a color developing mother nucleus of the dyestuff; B is a connecting group; Z is $-COOR^6$, $-CONR^7R^8$, $-OCOR^9$, $-OCOOR^{10}$, $-OCONHR^{11}$, $-NHR^{12}$, $-NR^{13}R^{14}$ or $-SO_2NR^{15}R^{16}$; each of $R^6$ and $R^9$ to $R^{16}$ is independently an unsubstituted or substituted alkyl group, unsubstituted or substituted cycloalkyl group, unsubstituted or substituted aryl group or unsubstituted or substituted aralkyl group; each of $R^7$ and $R^8$ is independently an unsubstituted or substituted alkyl group, unsubstituted or substituted cycloalkyl group, unsubstituted or substituted aryl group, unsubstituted or substituted aralkyl group, or hydrogen atom; and $m^3$ is an integer of 1–20. Formula (5) being $$\text{Dye}^1-E-\text{Dye}^1 \quad (5)$$

wherein $\text{Dye}^1$ is a color developing mother nucleus of the dyestuff; and E is a connecting group.

Examples of the color developing mother nucleus of the dyestuff represented by $\text{Dye}^1$ and $\text{Dye}^2$ in the formulae (1) to (5) include anthraquinone derivatives such as 1,4-bis-anilinoanthraquinone, 1,4-bis-(4-ethyl-2,6-dimethylanilino)anthraquinone, 1,4-bis-(2,4,6-trimethylanilino)anthraquinone, 1,4-bis-(6-bromo-2,4-dimethylanilino)anthraquinone, 1,4-bis-anilino-5,8-dihyroxyanthraquinone, 1,5-diamino-4,8-dihydroxyanthraquinone, 1-toluylamino-4-hydroxyanthraquinone, 1,4-diamino-2-phenylthioanthraquinone and 1-amino-2-phenoxy-4-hydroxyanthraquinone; phthalocyanine derivatives such as copper phthalocyanine, nickel phthalocyanine, cobalt phthalocyanine, palladium phthalocyanine, and these derivatives which are substituted by halogen atoms and alkyl groups; quinophthalone derivatives such as C.I. Disperse Yellow 54 and C.I. Disperse Yellow 64; azo derivatives such as a diphenyl azo compound, thiazole-phenylazo compound, isothiazole-phenylazo compound, thiophene-phenylazo compound, pyridine-phenylazo compound, imidazol-phenylazo compound, pyridone-phenylazo compound, pyrazolone-phenylazo compound, benzothiazole-phenylazo compound and benzoisothiazole-phenylazo compound; and cyanine derivatives.

Examples of the preferable color developing mother nucleus represented by $\text{Dye}^2$ include anthraquinone derivatives such as 1,4-bis-anilinoanthraquinone, 1,4-bis-(4-ethyl-2,6-dimethylanilino)anthraquinone, 1,4-bis-(2,4,6-trimethylanilino)anthraquinone, 1,4-bis-(6-bromo-2,4-dimethylanilino)anthraquinone, 1,4-bis-anilino-5,8-dihydroxyanthraquinone, 1,5-diamino-4,8-dihydroxyanthraquinone, 1-toluylamino-4-hydroxyanthraquinone, 1,4-diamino-2-phenylthioanthraquinone and 1-amino-2-phenoxy-4-hydroxyanthraquinone; quinophthalone derivatives such as C.I. Disperse Yellow 54 and C.I. Disperse Yellow 64; azo derivatives such as a diphenyl azo compound, thiazolephenylazo compound, isothiazole-phenylazo compound, thiophene-phenylazo compound, pyridine-phenylazo compound, imidazol-phenylazo compound, pyridone-phenylazo compound, pyrazone-phenylazo compound and benzoisothiazole-phenylazo compound; and cyanine derivatives, which are mentioned in literature, e.g., H. A. Lubs, "The Chemistry of Synthetic Dyes and Pigments", Hafner Publishing Company; and K. Venkataraman, "The Chemistry of Synthetic Dyes", Academic Press, Vols. 1–6.

The above-mentioned color developing mother nucleus of the dyestuff may have 1 to 10 of the below-described substituents.

Examples of the substituents include straight-chain and branched alkyl groups such as a methyl group, ethyl group, n-propyl group, iso-propyl group, n-butyl group, iso-butyl group, sec-butyl group, t-butyl group, n-pentyl group, iso-pentyl group, neo-pentyl group, 1,2-dimethylpropyl group, n-hexyl group, n-dodecyl group, 2-methylbutyl group, 2-methylpentyl group, 1,3-dimethylbutyl group, 1-isopropylpropyl group, 1,2-dimethylbutyl group, n-heptyl group, 1,4-dimethylpentyl group, 2-methyl-1-iso-propylpropyl group, 1-ethyl-3-methylbutyl group, n-octyl group, 2-ethylhexyl group, 2-methyl-1-iso-propylbutyl group, 2,2-dimethyl-1-iso-propyl-1-t-butylpropyl group and n-nonyl group; alkoxyalkyl groups such as a methoxymethyl group, methoxyethyl group, ethoxyethyl group, propoxyethyl group, butoxyethyl group, γ-methoxypropyl group, y-ethoxypropyl group, methoxyethoxyethyl group, ethoxyethoxyethyl group, dimethoxymethyl group, diethoxymethyl group, dimethoxyethyl group and diethoxyethyl group; halogenated alkyl groups such as a chloromethyl group, 2,2,2-trichloroethyl group, trifluoromethyl group and 1,1,1,3,3,3-hexafluoro-2-propyl group; hydroxyalkyl groups such as a hydroxymethyl group, hydroxyethyl group, hydroxypropyl group, hydroxybutyl group, hydroxypentyl group and hydroxyoctyl group; unsubstituted aryl groups such as a phenyl group, naphthyl group and indenyl group; substituted aryl groups such as a phenyl group, naphthyl group and indenyl group having any of straight-chain and branched alkyl groups such as a methyl group, ethyl group, propyl group, iso-propyl group, butyl group, 2-methylpropyl group, pentyl group and neo-pentyl group, alkoxy groups such as a methoxy group, ethoxy group and propoxy group, and halogen atoms such as a chlorine atom, fluorine atom, bromine atom and iodine atom; unsubstituted aryloxy groups such as a phenoxy group and naphthyloxy group; substituted aryloxy groups such as a phenoxy group and naphthyloxy group having any of straight-chain and branched alkyl groups such as a methyl group, ethyl group, propyl group, iso-propyl group, butyl group, 2-methylpropyl group, pentyl group and neo-pentyl group, alkoxy groups such as a methoxy group, ethoxy group and propoxy group, and halogen atoms such as a chlorine atom, fluorine atom, bromine atom and iodine atom; unsubstituted arylthio groups such as a phenylthio group and naphthylthio group; substituted arylthio groups such as a phenylthio group and naphthylthio group having any of straight-chain and branched alkyl groups such as a methyl group, ethyl group, propyl group, iso-propyl group, butyl group, 2-methylpropyl group, pentyl group and neo-pentyl group, alkoxy groups such as a methoxy group, ethoxy group and propoxy group, and halogen atoms such as a chlorine atom, fluorine atom, bromine atom and iodine atom; unsubstituted arylamino groups such as a phenylamino group and naphthylamino group; substituted arylamino groups such as a phenylamino group and naphthylamino group having any of straight-chain and branched alkyl groups such as a methyl group, ethyl group, propyl group, iso-propyl group, butyl group, 2-methylpropyl group, pentyl group and neo-pentyl group, alkoxy groups such as a methoxy group, ethoxy group and propoxy group, and halogen atoms such as a chlorine atom, fluorine atom, bromine atom and iodine atom; straight-chain and branched alkylamino groups such as a methylamino group, ethylamino group, n-propylamino group, iso-propylamino group, n-butylamino group, iso-butylamino group, sec-butylamino group, t-butylamino group, n-pentylamino group, iso-pentylamino group, neo-pentylamino group, 1,2-dimethylpropylamino group, n-hexylamino group, n-dodecylamino group, 2-methylbutylamino group, 2-methylpentylamino group, 1,3-dimethylbutylamino group, 1-isopropylpropylamino group, 1,2-dimethylbutylamino group, n-heptylamino group, 1,4-dimethylpentylamino group, 2-methyl-1-iso-propylpropylamino group, 1-ethyl-3-methylbutylamino group, n-octylamino group, 2-ethylhexylamino group, 2-methyl-1-iso-propylbutylamino group, 2,2-dimethyl-1-iso-propyl-1-t-butylpropylamino group and n-nonylamino group; straight-chain and branched dialkylamino groups such as a dimethylamino group, diethylamino group, di(n-propyl)amino group, di(iso-propyl)amino group, di(n-butyl)amino group, di(iso-butyl)amino group, di(sec-butyl)amino group, di(t-butyl)amino group, di(n-pentyl)amino group, di(isopentyl)amino group, di(neo-pentyl)amino group, di(1,2dimethylpropyl)amino group, di(n-hexyl)amino group, di(n-dodecyl)amino group, di(2-methylbutyl)amino group, di(2-methylpentyl)amino group, di(1,3-dimethylbutyl)amino group, di(1-iso-propylpropyl)amino group, di(1,2-dimethylbutyl)amino group, di(n-heptyl)amino group, di(1,4-dimethylpentyl)amino group, di(2-methyl-1-iso-propylpropyl)amino group, di(1-ethyl-3-methylbutyl)amino group, di(n-octyl)amino group, di(2-ethylhexyl)amino group, di(2-methyl-1-isopropylbutyl)amino group, di(2,2-dimethyl-1-iso-propyl-1-t-butylpropyl)amino group and di(n-nonyl)amino group; and an amino group; hydroxy group; nitro group; cyano group; and halogen atoms such as a chlorine atom, bromine atom, iodine atom and fluorine atom.

A substituent substituted on $Dye^1$ and $Dye^2$ in the formulae (1) to (4) and a connecting group E in the formula (5) can be bonded to the above-mentioned substituent substituted on the color developing mother nucleus of the dyestuff.

Examples of the solvent which can be used in the present invention include aromatic hydrocarbons such as toluene and xylene, ketones such as cyclohexane and methyl ethyl ketone, CELLOSOLVES such as ETHYLCELLOSOLVE, an ester such as ethyl acetate, alcohols such as methanol, ethanol and propanol, acetates such as ETHYLCELLOSOLVE acetate and METHYLCELLOSOLVE acetate, tetrahydrofuran and water. The water-soluble photo-setting resin precursor means a photo-setting resin precursor which is dissolved as much as 0.1% by weight or more in water, and the dispersion state means a state where particles having a diameter of 0.1 μm or more are present in the resin composition. Furthermore, the uniform coloring means that coloring is carried out so uniformly that the dye particles having a diameter of 0.1 μm or more are not present in the photo-cured resin.

Examples of the alkylene group represented by A' in the formula (1) include a methylene group, ethylene group, methylethylene group, 1,2-dimethylethylene group, propylene group, butylene group, methoxymethylethylene group and hexylene group. An example of the polyether connecting group is a group represented by the formula:

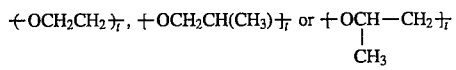

wherein t is an integer of 1 to 10, and an example of the polyalkyleneamino connecting group is a group represented by the formula:

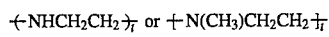

wherein t is an integer of 1 to 10.

Examples of the group represented by $Y^1$ in the formula (1) include alkoxy groups such as a methoxy group, ethoxy group, propoxy group, butoxy group, pentoxy group, hexyloxy group, heptyloxy group, octyloxy group, methoxyethoxy group, ethoxyethoxy group, butoxyethoxy group and ethoxyethoxyethoxy group; dialkylamino groups such as a dimethylamino group, diethylamino group, dipropylamino group, methylethylamino group and dibutylamino group; alkylamino groups such as a methylamino group, ethylamino group, propylamino group, hexylamino group and butylamino group; and trialkylammonium groups such as a trimethylammonium chloride group, triethylammonium bromide group, tributylammonium iodide group, tripropylammnoium tetrafluoroborate group and benzyldimethylammonium hexafluorophosphate group.

Examples of the alkyl group represented by $R^1$, $R^2$ and $R^3$ in the formula (2) include straight-chain and branched hydrocarbons such as a methyl group, ethyl group, propyl group, t-butyl group, pentyl group, hexyl group, heptyl group, octyl group, nonyl group and decyl group.

Examples of the unsubstituted alkyl group in the formula (4) include straight-chain and branched alkyl groups such as a methyl group, ethyl group, n-propyl group, iso-propyl group, n-butyl group, iso-butyl group, sec-butyl group, t-butyl group, n-pentyl group, iso-pentyl group, neo-pentyl group, 1,2-dimethylpropyl group, n-hexyl group, n-dodecyl group, 2-methylbutyl group, 2-methylpentyl group, 1,3-dimethylbutyl group, 1-iso-propylpropyl group, 1,2-dimethylbutyl group, n-heptyl group, 1,4-dimethylpentyl group, 2-methyl-1-iso-propylpropyl group, 1-ethyl-3-methylbutyl group, n-octyl group, 2-ethylhexyl group, 2-methyl-1-iso-propylbutyl group, 2,2-dimethyl-1-iso-propyl-1-t-butylpropyl group and n-nonyl group. Furthermore, examples of the substituted alkyl group in the formula (4) include alkoxyalkyl groups such as a methoxymethyl group, methoxyethyl group, ethoxyethyl group, propoxyethyl group, butoxyethyl group, γ-methoxypropyl group, γ-ethoxypropyl group, methoxyethoxyethyl group, ethoxyethoxyethyl group, dimethoxymethyl group, diethoxymethyl group, dimethoxyethyl group and diethoxyethyl group, halogenated alkyl groups such as a chloromethyl group, 2,2,2-trichloroethyl group, trifluoromethyl group and 1,1,1,3,3,3-hexafluoro-2-propyl group, and hydroxyalkyl groups such as a hydroxymethyl group, hydroxyethyl group, hydroxypropyl group, hydroxybutyl group, hydroxypentyl group and hydroxyoctyl group.

Examples of the unsubstituted cycloalkyl group include a cyclopentyl group and cyclohexyl group. Examples of the substituted cycloalkyl group include a cyclopentyl group and cyclohexyl group which are substituted by any of alkyl groups such as a methyl group, ethyl group and propyl group, alkoxy groups such as a methoxy group, ethoxy group and butoxy group, halogen atoms such as a chlorine atom, bromine atom, fluorine atom and iodine atom, a cyano group, nitro group, and hydroxyl group.

Examples of the unsubstituted aryl group include a phenyl group, naphthyl group and indenyl group. Examples of the substituted aryl group include a phenyl group, naphthyl group and indenyl group having any of straight-chain and branched alkyl groups such as a methyl group, ethyl group, propyl group, iso-propyl group, butyl group, 2-methylpropyl group, pentyl group and neo-pentyl group, alkoxy groups such as a methoxy group, ethoxy group and propoxy group, and halogen atoms such as a chlorine atom, fluorine atom, bromine atom and iodine atom.

Examples of the unsubstituted aralkyl group include a benzyl group and phenethyl group. Examples of the substituted aralkyl group include a benzyl group and phenethyl group having any of straight-chain and branched alkyl groups such as a methyl group, ethyl group, propyl group, iso-propyl group, butyl group, 2-methylpropyl group, pentyl group and neo-pentyl group, alkoxy groups such as a methoxy group, ethoxy group and propoxy group, and halogen atoms such as a chlorine atom, fluorine atom, bromine atom and iodine atom.

As the connecting group B in the formula (4), any one is acceptable, so long as it is a divalent connecting group. Examples of the connecting group B include alkylene groups such as a methylene group, ethylene group, methylethylene group, 1,2-dimethylethylene group, propylene group, butylene group, methoxymethylethylene group and hexylene group, a polyether group represented by the formula:

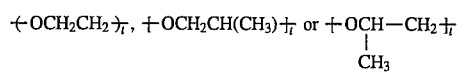

wherein t is an integer of 1 to 10, and a polyalkyleneamino group represented by the formula:

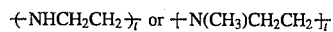

wherein t is an integer of 1 to 10.

The connecting group B may be omitted to directly connect the group Z to $Dye^1$.

As the connecting group represented by E in the formula (5), any one is acceptable, so long as it is a divalent connecting group. Examples of the connecting group E include the following formula:

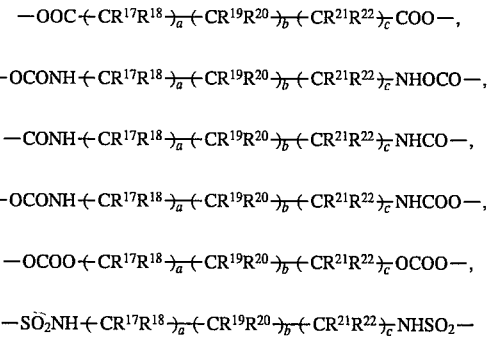

wherein each of $R^{17}$ to $R^{22}$ is independently a hydrogen atom; halogen atom; hydroxy group; —SH group; amino group; straight-chain and branched alkyl groups such as a methyl group, ethyl group, n-propyl group, iso-propyl group, n-butyl group, iso-butyl group, sec-butyl group, t-butyl group, n-pentyl group, iso-pentyl group, neo-pentyl group, 1,2-dimethylpropyl group, n-hexyl group, n-dodecyl group, 2-methylbutyl group, 2-methylpentyl group, 1,3-dimethylbutyl group, 1-iso-propylpropyl group, 1,2-dimethylbutyl group, n-heptyl group, 1,4-dimethylpentyl group, 2-methyl-1-iso-propylpropyl group, 1-ethyl-3-methylbutyl group, n-octyl group, 2-ethylhexyl group, 2-methyl-1-iso-propylbutyl group, 2,2-dimethyl-1-iso-propyl-1-t-butylpropyl group and n-nonyl group; alkoxyalkyl groups such as a methoxymethyl group, methoxyethyl group, ethoxyethyl group, propoxyethyl group, butoxyethyl group, γ-methoxypropyl group, γ-ethoxypropyl group, methoxyethoxyethyl group, ethoxyethoxyethyl group, dimethoxymethyl group, diethoxymethyl group, dimethoxyethyl group and diethoxyethyl group; halogenated alkyl groups such as a chloromethyl group, 2,2,2-trichloroethyl group, trifluoromethyl group and 1,1,1,3,3,3-hexafluoro-2-propyl group; hydroxyalkyl groups such as a hydroxymethyl group, hydroxyethyl group, hydroxypropyl group, hydroxybutyl group, hydroxypentyl group and hydroxyoctyl group; cycloalkyl groups such as a cyclopentyl group and cyclohexyl group; substituted cycloalkyl groups such as a cyclopentyl group and cyclohexyl group which are substituted by any of alkyl groups such as a methyl group, ethyl group and propyl group, alkoxy groups such as a methoxy group, ethoxy group and butoxy group, halogen atoms such as a chlorine atom, bromine atom, fluorine atom and iodine atom, a cyano group, nitro group, and hydroxyl group; unsubstituted aryl groups such as a phenyl group, naphthyl group and indenyl group; substituted aryl groups such as a phenyl group, naphthyl group and indenyl group having any of straight-chain and branched alkyl groups such as a methyl group, ethyl group, propyl group, iso-propyl group, butyl group, 2-methylpropyl group, pentyl group and neo-pentyl group, alkoxy groups such as a methoxy group, ethoxy group and propoxy group, and halogen atoms such as a chlorine atom, fluorine atom, bromine atom and iodine atom; straight-chain and branched alkylamino groups such as a methylamino group, ethylamino group, n-propylamino group, iso-propylamino group, n-butylamino group, iso-butylamino group, sec-butylamino group, t-butylamino group, n-pentylamino group, iso-pentylamino group, neo-pentylamino group, 1,2-dimethylpropylamino group, n-hexylamino group, n-dodecylamino group, 2-methylbutylamino group, 2-methylpentylamino group, 1,3-dimethylbutylamino group, 1-isopropylpropylamino group, 1,2-dimethylbutylamino group, n-heptylamino group, 1,4-dimethylpentylamino group, 2-methyl-1-iso-propylpropylamino group, 1-ethyl-3-methylbutylamino group, n-octylamino group, 2-ethylhexylamino group, 2-methyl-1-iso-propylbutylamino group, 2,2-dimethyl- 1-iso-propyl-1-t-butylpropylamino group and n-nonylamino group; and dialkylamino groups such as a dimethylamino group, diethylamino group, di(n-propyl)amino group, di(iso-propyl)amino group, di(n-butyl)amino group, di(iso-butyl)amino group, di(sec-butyl)amino group, di(t-butyl)amino group, di(n-pentyl)amino group, di(isopentyl)amino group, di(neo-pentyl)amino group, di(1,2dimethylpropyl)amino group, di(n-hexyl)amino group, di(n-dodecyl)amino group, di(2-methylbutyl)amino group, di(2-methylpentyl)amino group, di(1,3-dimethylbutyl)amino group, di(1-iso-propylpropyl)amino group, di(1,2-dimethylbutyl)amino group, di(n-heptyl)amino group, di(1,4-dimethylpentyl)amino group, di(2-methyl-1-iso-propylpropyl)amino group, di(1-ethyl-3-methylbutyl)amino group, di(n-octyl)amino group, di(2-ethylhexyl)amino group, di(2-methyl-1-isopropylbutyl)amino group, di(2,2-dimethyl-1-iso-propyl-1-t-butylpropyl)amino group and di(n-nonyl)amino group.

Each of the above-mentioned symbols a, b and c is an integer of 0–20, and repeating units in parentheses may be mutually mixed and irregularly arranged. A more preferable connecting group is a connecting group in which two sulfonamide groups are connected with the interposition of a divalent aliphatic group, and typical examples of the more preferable connecting group include the following connecting groups:

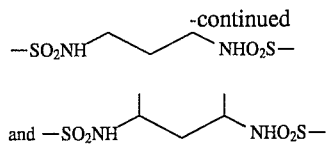

For the adjustment of colors, it is possible to use mixed dyestuffs.

The formation of a dyestuff layer can be carried out on an optically transparent substrate, and no particular restriction is put on the substrate to be used, so long as it permits the patterning of the dyestuff layer and the preparation of a color filter having a predetermined function.

Examples of the substrate include a glass plate, and resin films and plates of a polyvinyl alcohol, hydroxyethyl cellulose, methyl methacrylate, polyester, butyral, polyamide, polyethylene, polyvinyl chloride, polyvinylidene chloride, polycarbonate, polyolefin copolymer resin, vinyl chloride copolymer resin, vinylidene chloride copolymer resin and styrene copolymer resin. Furthermore, a patterned dyestuff layer can be formed integrally with a material applicable as the color filter.

In order to coat the substrate with the photo-setting resin composition of the present invention, a spin coat method, dip method or spray method can be utilized. The coated substrate may be dried by heating prior to photo-setting, whereby a coating solvent is eliminated.

As a light irradiating device which can be used to photo-cure the photo-setting resin composition of the present invention, there can be used a device mentioned in Photopolymer Social Meeting, "Photopolymer Handbook", Industrial Inquiry Association, pp. 515–582, (1989).

After the photo-setting, development may be carried out by the use of water, alkaline water, or an organic solvent such as methanol, toluene or a halogenated hydrocarbon.

Now, the present invention will be described in more detail in reference to examples, but the scope of the present invention should be limited to these examples.

EXAMPLE 1

A mixture of the following components was atomized into fine particles by means of a paint shaker.

Fifteen parts of a photo-setting resin precursor which was the below-described copolymer (6), 1 part of a dyestuff having the below-described formula (7), 84 parts of water, and 40 parts of glass beads.

The copolymer (6) having structure units of (B) and (C) as follows:

$$-[CH_2-CH(COOC_2H_4OH)]- \quad (B)$$

$$-[CH_2-CH(COOC_2H_4\overset{\oplus}{N}H(CH_3)_2) \; X^{\ominus}]- \quad (C)$$

wherein the content of (B) was about 50% and that of (C) was about 50%. Formula (7) being:

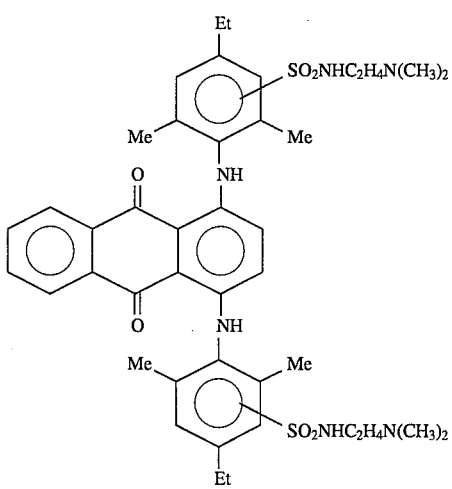

(7)

The glass beads were removed by the use of a wire net. Next, a glass substrate was coated with a mixed solution of the resultant filtrate and 2 parts of a crosslinking agent having formula (8):

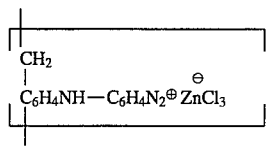

(8)

by a spin coat method. The solution on the substrate was pre-baked at 80° C. for 2 minutes, irradiated with light from a high-pressure mercury vapor lamp through a photomask, washed with water to remove the uncured portion, and then post-baked at 200°–230° C. for 15 minutes to prepare a blue filter. This filter had high light transmission and excellent durability.

EXAMPLE 2

A mixture of the following components was atomized into fine particles by means of a paint shaker.

Fifteen parts of photo-setting resin precursor which was the below-described copolymer (9), 1 part of a dyestuff having the below-described formula (10), 84 parts of water, and 40 parts of glass beads.

The copolymer (9) having structure units of (D) and (E) as follows:

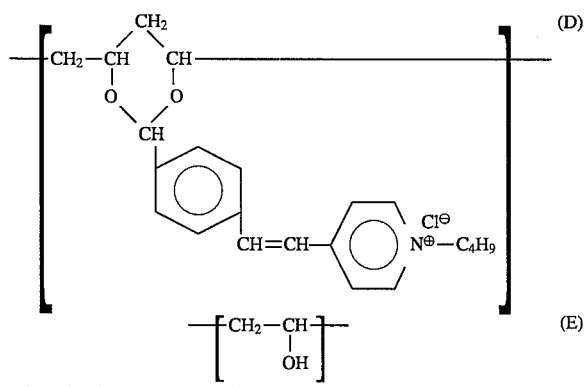

wherein the content of (D) was about 5% and that of (E) was about 95%. Formula (10) being:

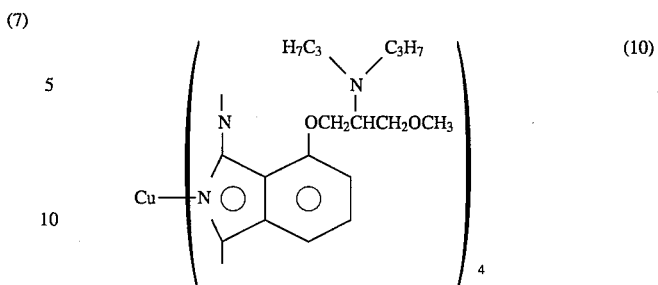

(10)

The glass beads were removed by the use of a wire net. Next, a glass substrate was coated with the resultant filtrate by a spin coat method. The solution on the substrate was pre-baked at 80° C. for 2 minutes, irradiated with light from a high-pressure mercury vapor lamp through a photomask, washed with water to remove the uncured portion, and then post-baked at 200°–230° C. for 15 minutes to prepare a green filter. This filter had high light transmission and excellent durability.

EXAMPLE 3

A mixture of the following components was atomized into fine particles by means of a paint shaker.

Eleven parts of photo-setting resin precursor which was the following copolymer (11), 3 parts of crosslinking agent having the following formula (12), 1 part of a dyestuff having the following formula (13), 84 parts of water, and 40 parts of glass beads.

The copolymer (11) having structure units of (F), (G) and (H) as follows:

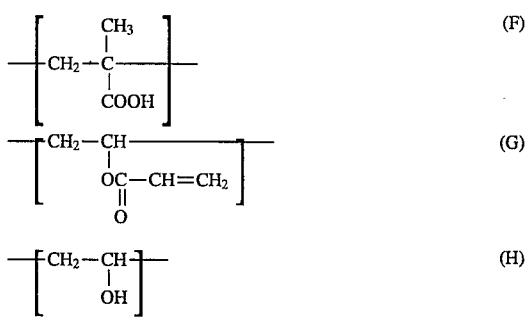

wherein the content of (F) was about 3%, that of (G) was 58%, and that of (H) was about 39%. Formulae (12) and (13) being:

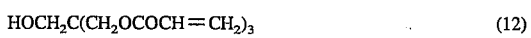

(12)

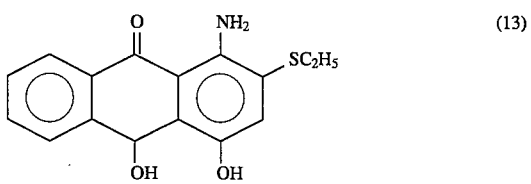

(13)

The glass beads were removed by the use of a wire net. Next, a glass substrate was coated with a mixture of the resultant filtrate and 1 part of a polymerization initiator represented by formula (14):

(14)

by a spin coat method. The solution on the substrate was pre-baked at 80° C. for 3 minutes, irradiated with light from a high-pressure mercury vapor lamp through a photomask, washed with water to remove an uncured portion, and then post-baked at 200°–230° C. for 15 minutes to prepare a red filter. This filter had high light transmission and excellent durability.

COMPARATIVE EXAMPLE

Color filters were prepared by the same procedure as in Example 1 by the use of phthalocyanine Blue as a blue dyestuff, by the same procedure as in Example 2 by the use of Phthalocyanine Green as a green dyestuff, and by the same procedure as in Example 3 by the use of diaminodianthraquinonyl as a red dyestuff.

In Table 1, the thus obtained color filters were compared in properties with the color filters prepared in Examples 1 to 3. The evaluation of the measured results was made as follows:

1. Light Transmission Properties (Green and blue)
o: This means that a maximum light transmission was 80% or more, when the light transmission was 10% or less at wave length at the maximum light transmission ±50 nm.
Δ: This means that a maximum light transmission was more than 70% and less than 80%, when the light transmission was 10% or less at wave length at the maximum light transmission ±50 nm.

x: This means that a maximum light transmission was 70% or less, when the light transmission was 10% or less at wave length at the maximum light transmission ±50 nm.

(Red)
o: This means that a light transmission at 620 nm was 80% or more, when the light transmission at 580 nm was 10% or less.
Δ: This means that a light transmission at 620 nm was less than 80%, when the light transmission at 580 nm was 10% or less.

TABLE 1

| | | Light Transmission Properties |
|---|---|---|
| Blue | Example 1 | o |
| | Comp. Example | Δ |
| Green | Example 2 | o |
| | Comp. Example | Δ |
| Red | Example 3 | o |
| | Comp. Example | Δ |

EXAMPLE 4

A mixture of the following components was atomized into fine particles by means of a paint shaker.

Fifteen parts of a photo-setting resin precursor which was the below-described copolymer (15), 1 part of a dyestuff having the below-described formula (16), 84 parts of water, and 40 parts of glass beads.

The copolymer (15) having structure units of (I) and (J) as follows:

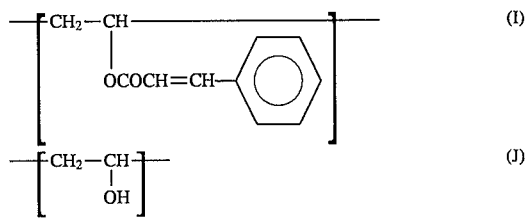

wherein the content of (I) was about 35%, and that of (J) was about 65%. Formula (16) being

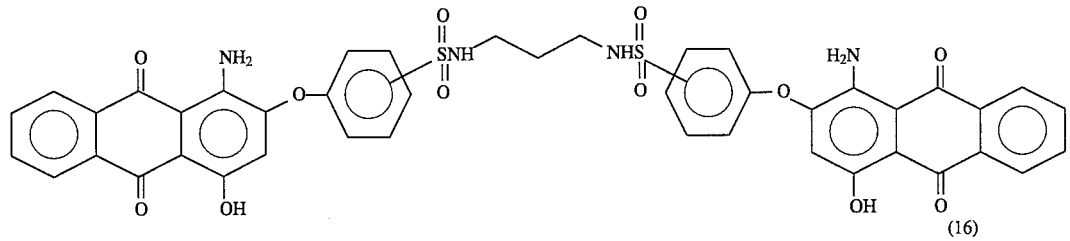

The glass beads were removed by the use of a wire net. Next, a glass substrate was coated with the resultant filtrate by a spin coat method. The solution on the substrate was irradiated with light from a high-pressure mercury vapor lamp through a photomask, and then washed with water to remove an uncured portion, whereby a filter was prepared. This filter had high light transmission and excellent durability.

EXAMPLE 5

A mixture of the following components was atomized into fine particles by means of a paint shaker.

Fifteen parts of a photo-setting resin precursor which was the below-described copolymer (17), 1 part of a dyestuff having the below-described formula (18), 84 parts of water, and 40 parts of glass beads.

The copolymer (17) having structure units of (K) and (L) as follows:

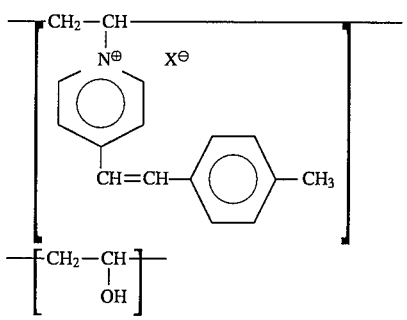

wherein the content of (K) was about 10%, and that of (L) was about 90%. Formula (18) being:

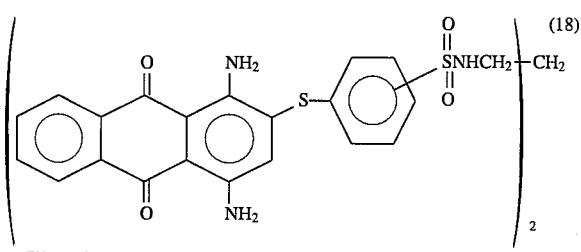

The glass beads were removed by the use of a wire net. Next, a glass substrate was coated with the resultant filtrate by a spin coat method. The solution on the substrate was irradiated with light from a high-pressure mercury vapor lamp through a photomask, and then washed with water to remove an uncured portion, whereby a filter was prepared. This filter had high light transmission and excellent durability.

EXAMPLE 6

A mixture of the following components was atomized into fine particles by means of a paint shaker.

15 parts of a photo-setting resin precursor which was the below-described copolymer (19), 1 part of a dyestuff having the below-described formula (20), 84 parts of water, and 40 parts of glass beads.

The copolymer (19) having structure units of (M), (N) and (O) as follows:

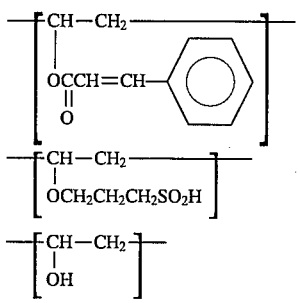

wherein the content of (M) was about 20%, that of (N) was about 5%, and that of (O) was about 75%. Formula (20) being:

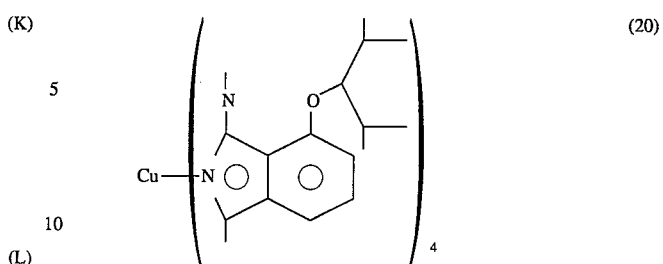

The glass beads were removed by the use of a wire net. Next, a glass substrate was coated with a mixture of the resultant filtrate and 1 part of a polymerization initiator represented by the above-mentioned formula (14) by a spin coat method. The solution on the substrate was irradiated with light from a high-pressure mercury vapor lamp through a photomask, and then washed with water to remove an uncured portion, whereby a filter was prepared. This filter had high light transmission and excellent durability.

EXAMPLE 7

A mixture of the following components was atomized into fine particles by means of a paint shaker.

11 parts of a photo-setting resin precursor which was the following copolymer (21), 1 part of a dyestuff having the following formula (22), 1 part of a dyestuff having the above-mentioned formula (20), 84 parts of water, and 40 parts of glass beads.

The copolymer (21) having structure units of (P), (Q) and (R) as follows:

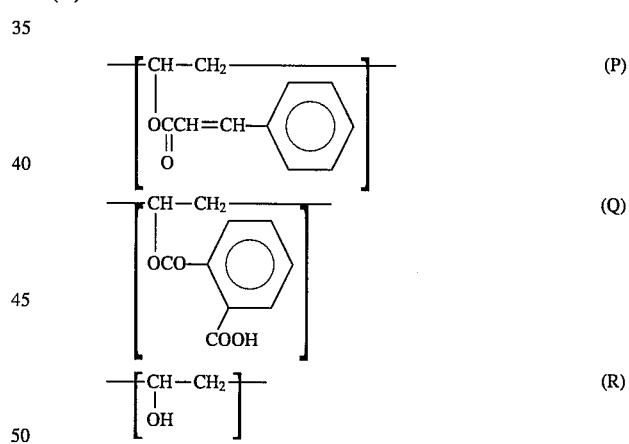

wherein the content of (P) was about 20%, that of (Q) was about 2%, and that of (R) was about 78%. Formula (22) being:

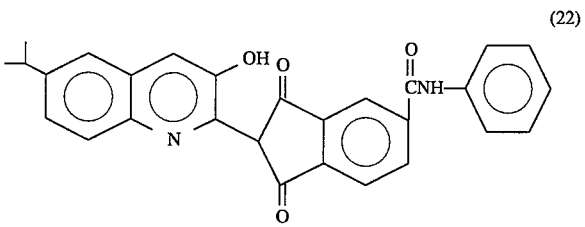

The glass beads were removed by the use of a wire net. Next, a glass substrate was coated with a mixture of the resultant filtrate and 1 part of a polymerization initiator represented by formula (23):

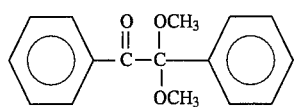 (23)

by a spin coat method. The solution on the substrate was irradiated with light from a high-pressure mercury vapor lamp through a photomask, and then washed with aqueous alkali to remove an uncured portion, whereby a filter was prepared. This filter had high light transmission and excellent durability.

EXAMPLES 8 TO 60

Color filters were prepared in accordance with the same procedure as in Example 1 by the use of dyestuffs and resins shown in Tables 2 to 6. The obtained filters had high light transmission and excellent durability.

TABLE 2

$$Dye^1-(SO_2-X^1-A^1-Y^1)_{q^1}$$

| Example | Dye[1] | $X^1$ | $A^1$ | $Y^1$ | $q^1$ | Resin |
|---|---|---|---|---|---|---|
| 8 | anthraquinone with NH₂, OH, O-phenyl substituents | NH | alkyl chain | H | 1 | Formula (6) |
| 9 | anthraquinone with NH₂, OH, O-phenyl substituents | NH | branched alkyl | piperidinyl | 1 | Formula (6) |
| 10 | anthraquinone with NH₂, OH, S-phenyl substituents | O | alkyl-O-alkyl | OCH₃ | 1 | Formula (11) |
| 11 | anthraquinone with NH₂, NH₂, S-phenyl substituents | NH | branched alkyl | N=CH-CH=CH₂ | 1 | Formula (11) |
| 12 | anthraquinone with NH₂, NH₂, S-phenyl substituents | O | alkyl-O-alkyl | OEt | 1 | Formula (19) |

TABLE 2-continued $Dye^1-(SO_2-X^1-A^1-Y^1)_{q^1}$

| Example | Dye$^1$ | X$^1$ | A$^1$ | Y$^1$ | q$^1$ | Resin |
|---|---|---|---|---|---|---|
| 13 | (quinoline-indandione dye with isopropyl and hydroxyl substituents and anilide carboxamide) | NH | branched alkyl | N=CH-CH=CH$_2$ | 1 | Formula (21) |
| 14 | (bromo-hydroxy quinoline-indandione dye with anilide carboxamide) | O | branched alkyl | OH | 1 | Formula (9) |
| 15 | (Cu phthalocyanine with 4 substituents) | NH | branched alkyl | H | 4 | Formula (6) |
| 16 | (Cu phthalocyanine with 4 substituents) | O | -CH$_2$CH$_2$-O-alkyl- | OC$_2$H$_5$ | 4 | Formula (6) |

TABLE 3

$$\text{Dye}^2-[X^2+\text{CH}_2)_{l^1}\left(\text{CH}\atop\text{NR}^1\text{R}^2\right)_{m^1}\left(\text{CH}_2\right)_{n^1}\left(\text{CH}\atop\text{OR}^3\right)_{p^1}-\text{H}]_{q^2}$$

| Example | Dye² | X² | R¹ | R² | R³ | $l^1$ | $m^1$ | $n^1$ | $p^1$ | $q^2$ | Resin |
|---|---|---|---|---|---|---|---|---|---|---|---|
| 17 | anthraquinone with NH₂, O-tolyl, OH | O | ethyl | isobutyl | butyl | 1 | 1 | 1 | 1 | 1 | Formula (6) |
| 18 | anthraquinone with NH₂, O-tolyl, OH | O | butyl | isobutyl | hexyl | 1 | 1 | 1 | 1 | 1 | Formula (6) |
| 19 | anthraquinone with NH₂, S-tolyl, NH₂ | O | butyl | butyl | hexyl | 1 | 1 | 1 | 1 | 1 | Formula (6) |
| 20 | anthraquinone with NH₂, S-tolyl, NH₂ | O | isopentyl | isopentyl | hexyl | 1 | 1 | 1 | 1 | 1 | Formula (9) |
| 21 | anthraquinone with NH₂, O-tolyl, O-tolyl, NH₂ | O | butyl | pentyl | pentyl | 1 | 1 | 1 | 1 | 2 | Formula (9) |

TABLE 3-continued $$Dye^2-[X^2+CH_2)_{l^1}+CH_{NR^1R^2})_{m^1}+CH_2)_{n^1}+CH_{OR^3}-H]_{q^2})_{p^1}$$

| Example | Dye² | X² | R¹ | R² | R³ | l¹ | m¹ | n¹ | p¹ | q² | Resin |
|---|---|---|---|---|---|---|---|---|---|---|---|
| 22 | (1,4-diamino-2,3-bis(p-tolyloxy)anthraquinone) | O | n-pentyl | n-pentyl | n-pentyl | 1 | 1 | 1 | 1 | 2 | Formula (11) |
| 23 | (hydroxyquinoline indanedione dye) | O | isobutyl | isobutyl | n-pentyl | 1 | 1 | 1 | 1 | 1 | Formula (11) |
| 24 | (Cu phthalocyanine, tetrasubstituted) | O | isobutyl | n-pentyl | n-pentyl | 1 | 1 | 1 | 1 | 4 | Formula (15) |
| 25 | (Cu phthalocyanine, tetrasubstituted) | O | isobutyl | isobutyl | n-pentyl | 1 | 1 | 1 | 1 | 4 | Formula (17) |

TABLE 3-continued $$Dye^2-[X^2+CH_2)_{l^1}(CH\underset{NR^1R^2}{\underbrace{\phantom{XXX}}})_{m^1}(CH_2)_{n^1}(CH\underset{OR^3}{\underbrace{\phantom{XXX}}})_{p^1}H]_{q^2}$$

| Example | Dye² | X² | R¹ | R² | R³ | l¹ | m¹ | n¹ | p¹ | q² | Resin |
|---------|------|----|----|----|----|----|----|----|----|----|-------|
| 26 | Cu-phthalocyanine (N,N substituted, 4 positions) | O | (chain) | (chain) | (chain) | 1 | 1 | 1 | 1 | 4 | Formula (19) |

TABLE 4

$$Dye^1-[(X^3-CHCH)_{l^2}(CH-CH)_{m^2}-H]_{q^3}$$
$$\text{with } R^4, R^5 \text{ on first CH group and } Y^2, Y^3 \text{ on second}$$

| Example | Dye¹ | $X^3$ | $R^4$ | $R^5$ | $Y^2$ | $Y^3$ | $l^2$ | $m^2$ | $q^3$ | Resin |
|---|---|---|---|---|---|---|---|---|---|---|
| 27 | 1-amino-4-hydroxy-2-phenoxy anthraquinone | O | H | H | H | H | 1 | 1 | 1 | Formula (9) |
| 28 | 1-amino-4-hydroxy-2-phenoxy anthraquinone | O | CH₃ | H | H | H | 1 | 1 | 1 | Formula (11) |
| 29 | 1-amino-4-hydroxy-2-(phenylthio) anthraquinone | O | CH₃ | CH₃ | OH | H | 1 | 1 | 1 | Formula (11) |
| 30 | 1,4-diamino-2,3-diphenoxy anthraquinone | O | H | H | H | H | 1 | 1 | 2 | Formula (11) |
| 31 | 1,4-diamino-2,3-diphenoxy anthraquinone | O | CH₃ | H | OH | H | 1 | 1 | 2 | Formula (17) |
| 32 | 1-anilino-4-hydroxy anthraquinone | O | H | H | H | H | 1 | 1 | 1 | Formula (17) |
| 33 | indanone-quinoline dye | O | H | H | H | H | 1 | 1 | 1 | Formula (17) |

TABLE 4-continued $$Dye^1-[(X^3-CHCH)_{l^2}(CH-CH)_{m^2}-H]_{q^3}$$
with substituents $R^4$, $R^5$ on first unit and $Y^2$, $Y^3$ on second unit.

| Example | Dye¹ | X³ | R⁴ | R⁵ | Y² | Y³ | l² | m² | q³ | Resin |
|---------|------|----|----|----|----|----|----|----|----|-------|
| 34 | [Cu phthalocyanine tetra-substituted] | O | H | H | H | H | 1 | 1 | 4 | Formula (19) |
| 35 | [Cu phthalocyanine tetra-substituted] | O | H | CH₃ | H | OH | 1 | 1 | 4 | Formula (6) |
| 36 | [Pd phthalocyanine tetra-substituted] | O | H | H | H | H | 2 | 0 | 4 | Formula (6) |

TABLE 5

$$Dye^1-(B-Z)_{m^3}$$

| Example | Dye¹ | B—Z | m³ | Resin |
|---------|------|-----|----|-------|
| 37 | [1-amino-4-hydroxy-2-phenoxy anthraquinone derivative] | $-\overset{O}{\underset{\|}{C}}N(C_2H_5)_2$ | 1 | Formula (6) |
| 38 | [1-amino-4-hydroxy-2-phenoxy anthraquinone derivative] | $-\overset{O}{\underset{O}{\overset{\|}{S}}}N(\text{tolyl})_2$ | 1 | Formula (21) |
| 39 | [1,4-diamino-2-phenylthio anthraquinone derivative] | $-\overset{O}{\underset{O}{\overset{\|}{S}}}N(C_8H_{17})_2$ | 1 | Formula (21) |
| 40 | [1,4-diamino-2-phenylthio anthraquinone derivative] | $-O-\overset{O}{\overset{\|}{C}}-CH_2CH(CH_3)_2$ | 1 | Formula (21) |

TABLE 5-continued $$Dye^1-(B-Z)_{m^3}$$

| Example | Dye¹ | B—Z | m³ | Resin |
|---|---|---|---|---|
| 41 | (anthraquinone with two NH₂ and two O-phenyl substituents) | —OC(=O)CH₂CH(CH₃)CH₂CH₃ | 2 | Formula (19) |
| 42 | (anthraquinone with two NH₂ and two O-phenyl substituents) | —S(=O)₂N(CH₂CH(CH₃)₂)₂ | 2 | Formula (11) |
| 43 | (quinoline-OH-indandione-CONH-cyclohexyl structure) | —S(=O)₂N(CH₂CH(CH₃)₂)₂ | 1 | Formula (11) |
| 44 | (isopropyl-Br-quinoline-OH-indandione-CONH-cyclohexyl structure) | —C(=O)NH-cyclohexyl | 1 | Formula (9) |
| 45 | Cu phthalocyanine tetrakis | —S(=O)₂N(C₅H₁₁)₂ | 4 | Formula (15) |
| 46 | Pd phthalocyanine tetrakis | —OC(=O)CH₂CH(CH₃)CH(CH₃)₂ | 4 | Formula (15) |
| 47 | Cu phthalocyanine tetrakis | —OC(=O)CH₂CH₂CH(CH₃)₂ | 4 | Formula (6) |

TABLE 6

Dye¹—E—Dye¹

| Example | Dye¹ | E | Resin |
|---|---|---|---|
| 48 | 1-amino-2-(4-methylphenoxy)-4-hydroxyanthraquinone | —OC(O)NH—CH₂CH₂—NHC(O)O— | Formula (6) |
| 49 | 1-amino-2-(4-methylcyclohexyloxy)-4-hydroxyanthraquinone | —S(O)₂NH—CH₂C(CH₃)₂CH₂—NHS(O)₂— | Formula (6) |
| 50 | 1,4-diamino-2-(4-methylphenylthio)anthraquinone | —S(O)₂NH—CH₂CH₂—NHS(O)₂— | Formula (9) |
| 51 | 1,4-diamino-2-(4-methylphenylthio)anthraquinone | —C(O)O—CH₂CH₂CH₂—OC(O)— | Formula (9) |
| 52 | 1,4-diamino-2-(methylthiomethyl)anthraquinone | —C(O)O—CH₂CH(CH₃)CH(CH₃)—OC(O)— | Formula (9) |
| 53 | 1-(4-methylphenylamino)-4-hydroxyanthraquinone | —S(O)₂NH—CH₂C(CH₃)₂CH₂—NHS(O)₂— | Formula (11) |
| 54 | hydroxy-acridine-indanone dye | —C(O)O—CH₂CH₂CH₂—OC(O)— | Formula (11) |
| 55 | aminoanthraquinone-imide-(4-methylphenyl) dye | —OC(O)—CH₂CH₂—C(O)O— | Formula (15) |

TABLE 6-continued

Dye¹—E—Dye¹

| Example | Dye¹ | E | Resin |
|---|---|---|---|
| 56 | [anthraquinone with NH-phenyl-CH₃ and OH] | −CO−O−(CH₂)₄−O−OC− | Formula (17) |
| 57 | [anthraquinone with NH₂, S−CH₂− and OH] | −CNH−(CH₂)₄−NHC− (C=O) | Formula (19) |
| 58 | [quinophthalone derivative with isopropyl and OH] | −OC−O−CH₂CH₂−CO−O (C=O) | Formula (19) |
| 59 | [anthraquinone with NH-phenyl-CH₃ and OH] | −CO−O−CH(CH₃)−CH(CH₃)−O−OC− | Formula (21) |
| 60 | [Cu phthalocyanine-type structure]₄ | −CH₂− | Formula (21) |

What is claimed is:

1. A photo-setting resin composition which comprises a water soluble photo-setting resin precursor and an oil soluble-dyestuff with dye particles having a diameter of 0.1 μm or more contained within said photo-setting precursor, wherein upon cure, the cured photo-setting resin composition is uniformly colored by the dyestuff, is free from any depolarization effect and is compatible with the dyestuff so that dye particles having a diameter of 0.1 μm or more are not present.

2. The photo-setting resin composition according to claim 1 further containing a solvent.

3. The photo-setting resin composition according to claim 2 wherein said solvent is water.

4. The photo-setting resin composition according to claim 1 wherein said photo-setting resin precursor is polyvinyl alcohol and/or a polyvinyl alcohol derivative.

5. The photo-setting resin composition according to claim 1 wherein said photo-setting resin precursor is polyacrylic acid and/or its derivative.

6. The photo-setting resin composition according to claim 1 wherein said dyestuff is a compound represented by formula (1):

$$\text{Dye}^1-(SO_2-X^1-A^1-Y^1)_{q^1} \quad (1)$$

wherein $Dye^1$ is a color developing mother nucleus of said dyestuff; $X^1$ is an oxygen atom, sulfur atom or NH group; $A^1$ is an alkylene group, polyether connecting group or polyalkyleneamino connecting group; $Y^1$ is a hydrogen atom, alkoxy group, dialkylamino group, alkylamino group, amino group, hydroxy group or trialkylammonium group; and $q^1$ is an integer of 1–10.

7. The photo-setting resin composition according to claim 6 wherein said $Dye^1$ is selected from the group consisting of anthraquinone derivatives, phthalocyanine derivatives, quinophthalone derivatives, azo derivatives and cyanine derivatives.

8. The photo-setting resin composition according to claim 1 wherein said dyestuff is a compound represented by formula (2):

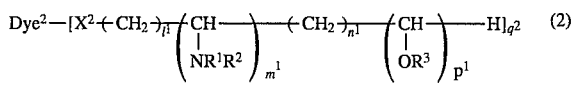

$$\text{Dye}^2-[X^2+CH_2)_{l^1}\left(\underset{NR^1R^2}{CH}\right)_{m^1}+CH_2)_{n^1}\left(\underset{OR^3}{CH}\right)_{p^1}H]_{q^2} \quad (2)$$

wherein $Dye^2$ is a color developing mother nucleus of said dyestuff; $X^2$ is an oxygen atom, sulfur atom or NH group; each of $R^1$, $R^2$ and $R^3$ is independently an alkyl group having 1 to 10 carbon atoms; each of $l^1$, $m^1$, $n^1$ and $p^1$ is an integer of 0–10; and $q^2$ is an integer of 1–10.

9. The photo-setting resin composition according to claim 8 wherein said $Dye^2$ is selected from the color developing mother nucleus group consisting of anthraquinone derivatives, quinophthalone derivatives, azo derivatives and cyanine derivatives.

10. The photo-setting resin composition according to claim 1 wherein said dyestuff is a compound represented by formula (3):

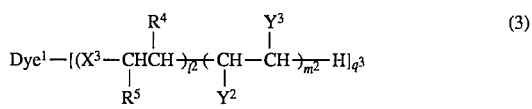

$$\text{Dye}^1-[(X^3-\underset{R^5}{\overset{R^4}{CHCH}})_{l^2}(\underset{Y^2}{\overset{Y^3}{CH-CH}})_{m^2}H]_{q^3} \quad (3)$$

wherein $Dye^1$ is a color developing mother nucleus of the dyestuff; $X^3$ is an oxygen atom, sulfur atom or NH group; each of $R^4$ and $R^5$ is independently a hydrogen atom, methyl group or ethyl group; each of $Y^2$ and $Y^3$ is independently a hydrogen atom, OH group, SH group or $NH_2$ group; each of $l^2$ and $m^2$ is an integer of 0–10; and $q^3$ is an integer of 1–10.

11. The photo-setting resin composition according to claim 10, wherein said $Dye^1$ is selected from the group consisting of anthraquinone derivatives, phthalocyanine derivatives, quinophthalone derivatives, azo derivatives and cyanine derivatives.

12. The photo-setting resin composition according to claim 1 wherein said dyestuff is a compound represented by formula (4):

$$\text{Dye}^1-(B-Z)m^3 \quad (4)$$

wherein $Dye^1$ is a color developing mother nucleus of said dyestuff; B is a connecting group; Z is $-COOR^6$, $-CONR^7R^8$, $-OCOR^9$, $-OCOOR^{10}$, $-OCONHR^{11}$, $-NHR^{12}$, $-NR^{13}R^{14}$ or $-SO_2NR^{15}R^{16}$; each of $R^6$ and $R^9$ to $R^{16}$ is independently an unsubstituted or substituted alkyl group, unsubstituted or substituted cycloalkyl group, unsubstituted or substituted aryl group or unsubstituted or substituted aralkyl group; each of $R^7$ and $R^8$ is independently an unsubstituted or substituted alkyl group, unsubstituted or substituted cycloalkyl group, unsubstituted or substituted aryl group, unsubstituted or substituted aralkyl group, or hydrogen atom; and $m^3$ is an integer of 1–10.

13. The photo-setting resin composition according to claim 12, wherein said $Dye^1$ is selected from the group consisting of anthraquinone derivatives, phthalocyanine derivatives, quinophthalone derivatives, azo derivatives and cyanine derivatives.

14. The photo-setting resin composition according to claim 1 wherein said dyestuff is a compound represented by formula (5):

$$\text{Dye}^1-E-\text{Dye}^1 \quad (5)$$

wherein $Dye^1$ is a color developing mother nucleus of said dyestuff; and E is a connecting group.

15. The photo-setting resin composition according to claim 14, wherein said $Dye^1$ is selected from the group consisting of anthraquinone derivatives, phthalocyanine derivatives, quinophthalone derivatives, azo derivatives and cyanine derivatives.

* * * * *